United States Patent [19]

Hill

[11] 4,346,669

[45] Aug. 31, 1982

[54] VACUUM CHAMBER SEALS

[75] Inventor: Alan H. Hill, Bury, England

[73] Assignee: General Engineering Radcliffe 1979 Limited, Radcliffe, England

[21] Appl. No.: 195,765

[22] Filed: Oct. 10, 1980

[30] Foreign Application Priority Data

Oct. 12, 1979 [GB] United Kingdom ............... 7935440

[51] Int. Cl.³ .......................................... C23C 13/10
[52] U.S. Cl. ................................ 118/733; 277/237 R; 118/718
[58] Field of Search ......................... 118/50, 718, 733; 427/251; 34/242; 277/237 R, DIG. 7; 406/169; 118/719

[56] References Cited

U.S. PATENT DOCUMENTS

| 3,158,507 | 11/1964 | Alexander | 277/237 X |
| 3,351,348 | 11/1967 | Dupuis | 34/242 X |
| 3,367,667 | 2/1968 | Allen | 118/733 |
| 3,677,076 | 7/1972 | Herzhoff et al. | 118/50 X |
| 3,722,899 | 3/1973 | Sedwell | 118/718 |
| 4,087,992 | 5/1978 | Sando et al. | 34/242 X |

*Primary Examiner*—John D. Smith
*Assistant Examiner*—Bernard F. Plantz
*Attorney, Agent, or Firm*—Fleit & Jacobson

[57] ABSTRACT

A vacuum chamber seal at the entry or exit end of a vacuum chamber comprises two rollers 15, 16 one 16 of which is rotatable, defining an air lock gap. A guide tube 18, spaced from the gap but within the chamber, is constructed and disposed to promote and acceleration of the air flowing past it towards the gap resulting in a pressure drop on the roller side of the guide tube and a pressure differential across a web of material passing over the guide tube 18 and through the gap. This differential urges the web into initimate contact with the rotatable roller 16 to prevent oscillation of the web entering the gap.

12 Claims, 1 Drawing Figure

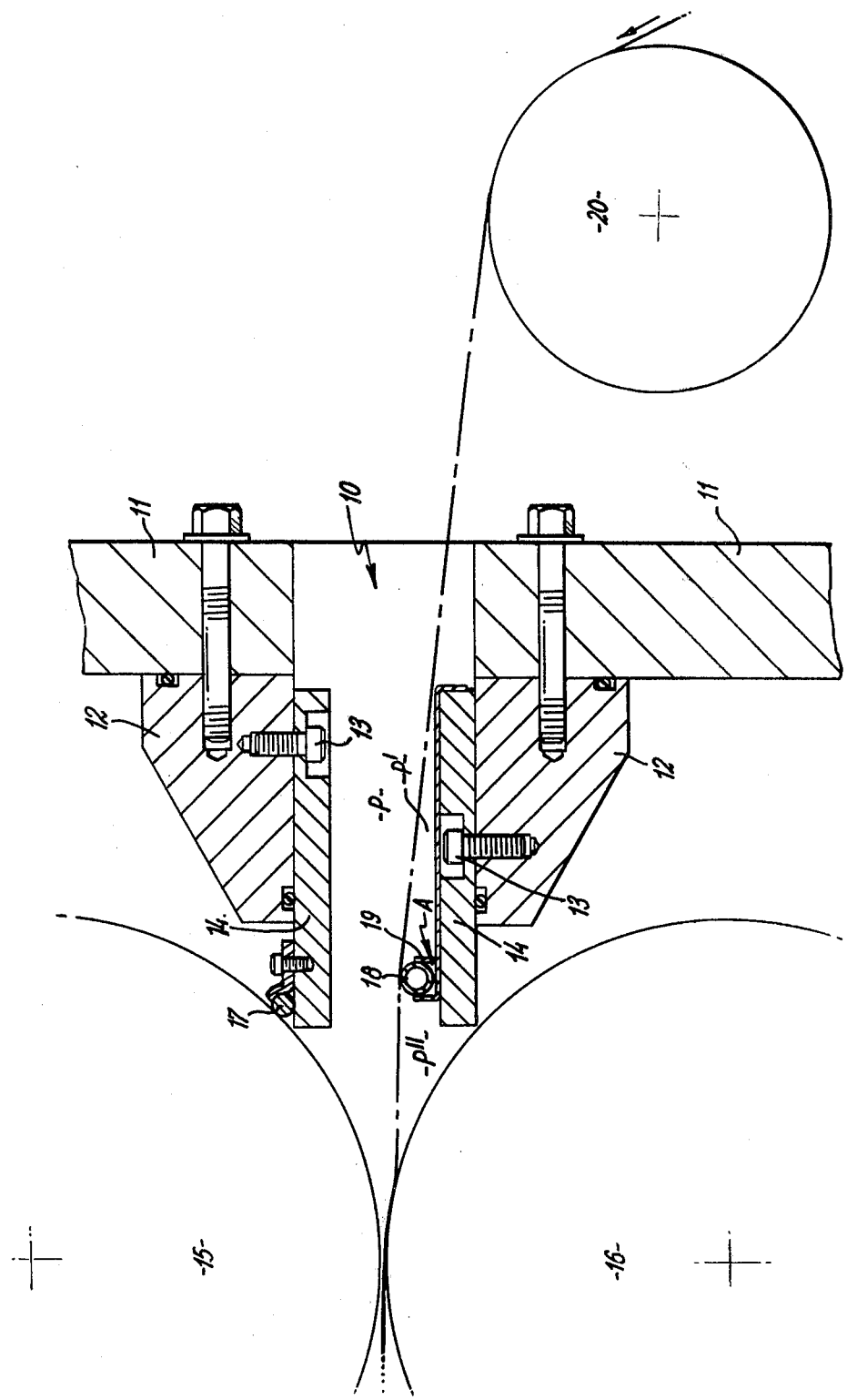

VACUUM CHAMBER SEALS

This invention concerns vacuum chamber seals and in particular though not exclusively vacuum chamber seals for chambers in which the metallising of flexible webs is to be carried out.

It is known to metallise flexible webs such as plastics material film and paper by vacuum deposition. One known apparatus by which such a process can be carried out includes a vacuum chamber within which a reel of material to be metallised can be located, together with a take-up reel for the metallised material and, of course, a means for evaporating the metal that is to be deposited on the material as it is unwound from one reel and wound onto the other. Such an apparatus can only be used for batch operation since when a reel of material has been metallised the chamber must be opened, unloaded and re-loaded. When re-loaded the chamber has to be evacuated and the metal (which is to be evaporated) heated before metallising can recommence.

It is also known to metallise materials using a so-called air-to-air vacuum metalliser in which apparatus supply and take-up reels for the material to be metallised are located outside the vacuum chamber.

An advantage of this type of apparatus is that it can be operated continuously due to the ability to join one length of material to another outside the vacuum chamber as metallising takes place. In such an apparatus the entry and exit apertures for the material being metallised must be kept as small as possible to ensure that the ingress of air into the vacuum chamber is kept to a minimum.

One apparatus of this type that has been proposed provides entry and exit seals incorporating a roller system in which the material to be treated is passed from one roller to the next of the system. In this apparatus sliding seals may be provided between the rollers and stationary blade-like seal elements. However, in such a system a differential pressure exists between the rollers and in some cases this is large enough to cause deflection of the rollers and thus a variable size space between them. To counter this disadvantage it is necessary to provide either very expensive vacuum pumping equipment and/or increase the size and strength of the rollers. The basic disadvantage still exists, however, namely that the material is transferred from one roller to another during passage through the seal with the consequent risk of damage either to the material, its coating, or both.

Another disadvantage with some of the air-to-air metallising plants for treating webs of material such as paper, plastics film, cellulose film and the like lies in the fact that at the entry and exit of the vacuum chamber there is, due to the fact that the entry and exit apertures cannot be completely sealed, a high velocity air stream which vibrates the web violently thus making it possible to damage the web and/or its coating and sufficiently under some circumstances to break the web.

It is an object of the present invention to provide a vacuum chamber seal, applicable to a vacuum chamber of an air-to-air metallising plant in which the disadvantage referred to above is eliminated or substantially eliminated.

Thus according to the present invention a vacuum chamber seal for the entry or exit of a web of material into the vacuum chamber includes an air lock gap defined by adjustable elements at least one of which is in the form of a roller and a web guide means on the atmospheric pressure side of the seal, such guide means being so disposed that, in use, it will ensure that the web makes intimate contact with the roller of the air lock gap a short distance from the gap and at the atmospheric pressure side thereof and is maintained in such intimate contact as it approaches and passes through the air lock gap.

BRIEF DESCRIPTION OF THE FIGURE

The invention will now be described further, by way of example only with reference to a somewhat schematic, part sectional elevation of a vacuum chamber seal adapted for use in the vacuum chamber of an air-to-air metallising plant.

Thus as can be seen, there is provided an aperture 10 (in the form of an elongate slot) in a wall 11 of the vacuum chamber. Secured to the internal face of the wall 11 of the chamber at each side of the aperture 10 is a mounting bar 12 on which is mounted, by studs 13, a carrier plate 14. As can be seen the carrier plates 14 extend inwardly (away from the wall 11) of the mounting bars 12 and each plate 14 terminates in close proximity to one of a pair of air lock gap defining rollers 15, 16. It is convenient for the space between the plates 14 and their adjacent rollers 15, 16 to be of the order of 0.15 mm. and for the roller diameters to be of the order of 270 mm.

The plate 14 which terminates adjacent the periphery of roller 15 is provided with a circular cross-section air-tight seal 17 and the roller 15 in the form of the invention being described is non-rotatable.

The plate 14 which terminates adjacent the roller 16 which is freely rotatable or driven as desired, is provided with a web guide tube 18, this being mounted adjacent the free edge of the plate 14 in narrow spaced-apart channel-section retainer members 19 mounted on plate 14.

The air lock gap between rollers 15, 16 is adjustable between an operating space of about 0.15 mm. to a web threading up space of about 2.0 mm. Since the seal is designed for use with joined (or spliced) webs, provision is made for momentarily widening the operating gap to about 0.30 mm to allow a splice or join to pass through the air lock gap.

The seal described can be used at both web inlet and web outlet openings of a vacuum chamber and when a web is threaded up it passes through aperture 10, over guide tube 18, through the air lock gap between rollers 15, 16, through further air locks and into the vacuum deposition space in the chamber, and, of course, out of the chamber through similar air locks and finally between air lock rollers, over a guide tube and through the outlet aperture in the chamber wall.

There is provided a web support and guide roll 20 adjacent the inlet and adjacent the outlet of the chamber and these rolls 20 are adjustable to ensure that the web just contacts the guide tubes 18 on entry and exit from the chamber.

The arrangement described is all located within the vacuum chamber wall 11 and thus only the spaces P and $P^1$ between the web and parts of the seal are at atmospheric pressure when the apparatus is in operation.

The space $P^{11}$ is at a pressure slightly below atmospheric but much greater than the pressure within the chamber, and, therefore, there is a relatively high velocity air flow indicated by arrow A, from space $P^1$ through the gaps between guide tube 18 and plate 14 into zone $P^{11}$ and through the gap between the periphery of roller 16 and plate 14.

As the air in region P approaches the air lock gap its velocity increases very rapidly and thus in the region of the air lock gap there is a zone $P^{111}$ in which the air pressure falls rapidly to a value very much lower than the pressure in the zone $P^{11}$. Thus as the web approaches the air lock gap on entry into the treatment chamber and it arrives at the position in which the pressure P above it is still greater than the pressure in zone $P^{11}$ it is pressed down onto the roller 16 before it reaches zone $P^{111}$ and thus as the web passes rollers 15 and 16 into the chamber undesirable vibration of the web in the air lock gap is prevented with consequent elimination of the risk of damage being done to the web. As the web passes out of the treatment chamber a similar pressure differential maintains the web in intimate contact with the roller 16 until the web has passed out of the zone $P^{111}$. Thus at the exit from the treatment chamber damage to the web and/or its coating is prevented.

What is claimed is:

1. A vacuum chamber seal for the entry or exit of a web of material into a vacuum chamber, including an air lock gap defined by adjustable elements, at least one of which is in the form of a roller, and a web guide means on an atmospheric pressure side of the seal, such guide means being so disposed that, in use, it will ensure that one side of the web makes intimate contact with the roller of the air lock gap a short distance from the gap and at the atmospheric pressure side thereof and is maintained in such intimate contact as the web approaches and passes through the air lock gap, the other side of the web being spaced from the other of the adjustable elements.

2. A vacuum chamber seal as claimed in claim 1, in which the guide means is constructed to promote an acceleration of the air stream passing by it to cause a reduction in air pressure on the roller side of the guide means and consequent pressure differential across the web of material urging the web towards the roller.

3. A vacuum chamber seal as claimed in claim 1, in which the guide means comprises two carrier plates extending from the interior of the vacuum chamber wall on opposite sides of the entry to define a channel leading towards the air lock gap.

4. A vacuum chamber seal as claimed in claim 3, in which one carrier plate extends up to but does not contact the roller and the other carrier plate extends up to but does not contact the other of the adjustable elements, a seal being disposed between the other carrier plate and the other adjustable element.

5. A vacuum chamber seal as claimed in claim 4, in which the guide means comprises a member extending substantially parallel to the air lock gap supported on the said one carrier plate to define an air gap therebetween through which air accelerates in operation and which, in operation, guides the web of the material towards the air lock gap.

6. A vacuum chamber seal as claimed in claim 5, in which the member is of circular cross-section.

7. A vacuum chamber seal as claimed in claim 5, in which a web support and guide roller is provided externally of the vacuum chamber and is adjustable in relation to the member to ensure that, in operation, the web of material does not contact the vacuum chamber between the member and the guide roller.

8. A vacuum chamber seal as claimed in claim 1, in which both adjustable elements are rollers, but only the roller contacted, in operation, by the web of material is rotatable.

9. A vacuum chamber seal as claimed in claim 3, in which the gap between the carrier plates and the associated respective rollers is 0.15 mm and the diameter of the roller is 270 mm.

10. A vacuum chamber seal as claimed in claim 1, in which the gap between the adjustable elements is adjustable between an operating gap of 0.15 mm and a web threading gap of 2.00 mm, provision being made for momentarily widening the operating gap to 0.30 mm to allow a splice in the material web to pass through.

11. A vacuum chamber seal for use with entry of a web of material having first and second sides into a vacuum chamber and for use with exit of a web of material from the vacuum chamber, said seal comprising:

a rotatable roller for contacting a first side of the web of material entering and leaving the vacuum chamber;

an element cooperating with the roller to define an air lock gap therebetween, the spacing between the roller and element being adjustable to vary the size of the air lock gap so that the size of the gap is larger than the thickness of the web of material passing through the air lock gap; and web guide means on an atmospheric pressure side of the air lock gap for contacting the first side of the web of material and for cooperating with the rotatable roller to maintain a negative pressure on the first side of the web of material which is less than the pressure on the second side so that the pressure differential urges the first side of the web of material into contact with the rotatable roller.

12. A vacuum chamber seal according to claim 11, in which a web support and guide roller is provided externally of the vacuum chamber and is adjustable in relation to the web guide means to ensure that, in operation, the web of material does not contact the vacuum chamber between the web guide means and the guide roller.

* * * * *